United States Patent

Akaike et al.

[11] Patent Number: 5,912,555
[45] Date of Patent: Jun. 15, 1999

[54] PROBE APPARATUS

[75] Inventors: Yutaka Akaike; Chiaki Mochizuki; Isao Kono; Haruhiko Yoshioka, all of Yamanashi-ken, Japan

[73] Assignee: Tokyo Electron Limited, Tokyo, Japan

[21] Appl. No.: 08/628,516

[22] Filed: Apr. 5, 1996

[30] Foreign Application Priority Data

Apr. 10, 1995 [JP] Japan .................................. 7-109041
Nov. 16, 1995 [JP] Japan .................................. 7-323805

[51] Int. Cl.⁶ .................................................. G01R 31/02
[52] U.S. Cl. .......................................... 324/158.1; 324/758
[58] Field of Search ............................... 324/158.1, 758, 324/759, 765, 763

[56] References Cited

U.S. PATENT DOCUMENTS 3,437,929  4/1969  Glenn .................................. 324/759
4,527,942  7/1985  Smith .................................. 324/758
5,440,943  8/1995  Holt et al. .......................... 324/758

Primary Examiner—Ernest F. Karlsen
Attorney, Agent, or Firm—Oblon, Spivak, McClelland, Maier & Neustadt, P.C.

[57] ABSTRACT

A probe apparatus comprising an apparatus body fitted with a probing card having a probe connected electrically with an electrode of an object of inspection, a test head operatively mounted on the apparatus body and electrically continuous with the probe of the probing card, rotating mechanism for rotating the test head, and vertical moving mechanism for vertically raising or lowering the test head.

17 Claims, 13 Drawing Sheets

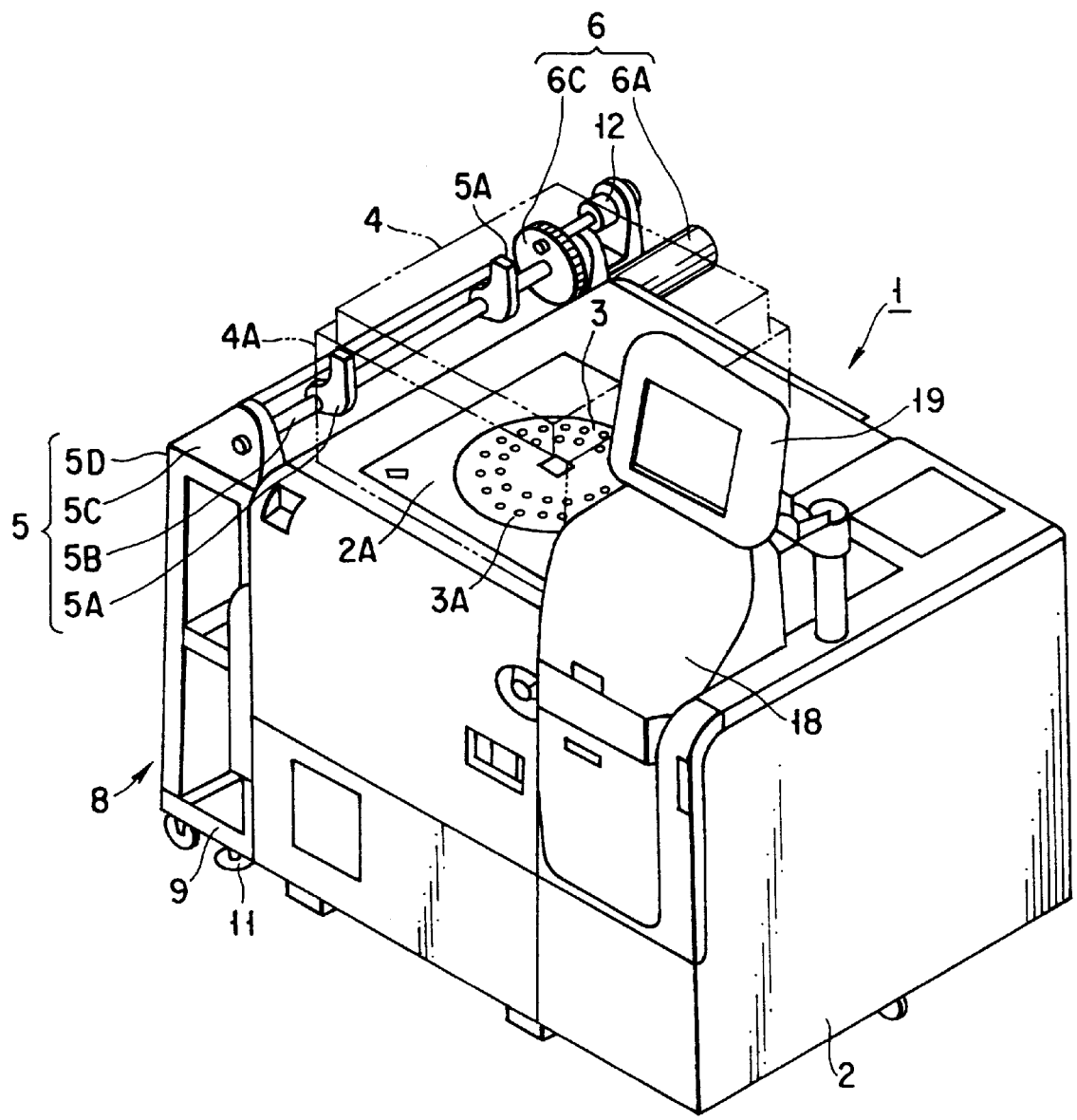
F I G. 1

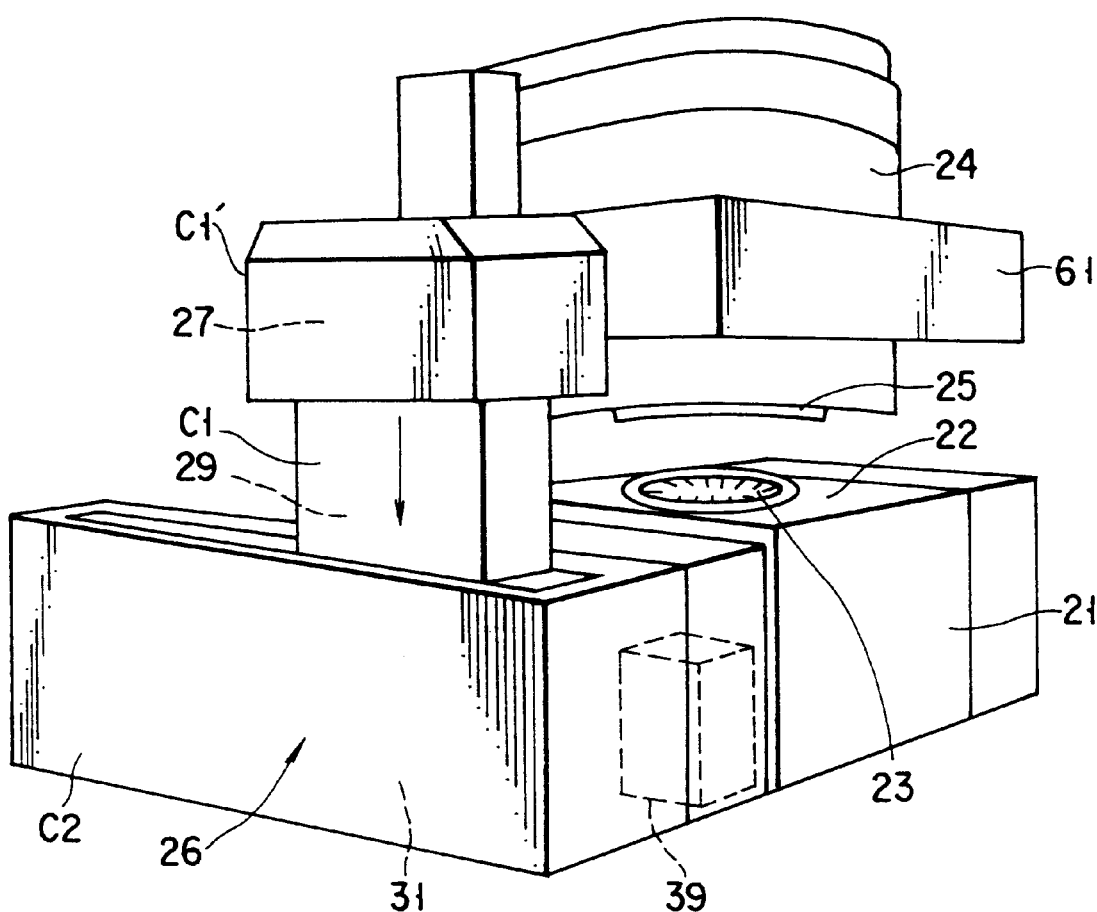
F I G. 5

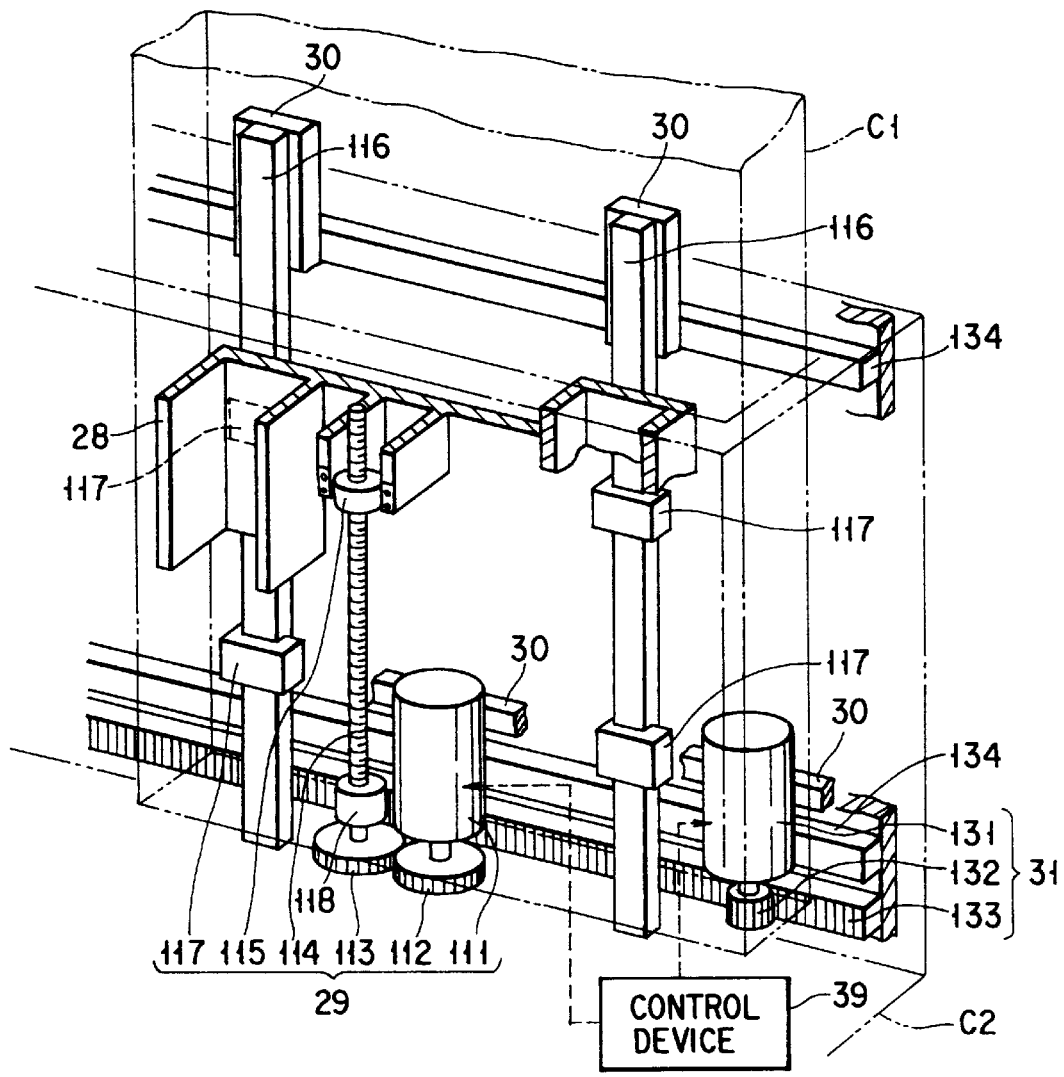
F I G. 10

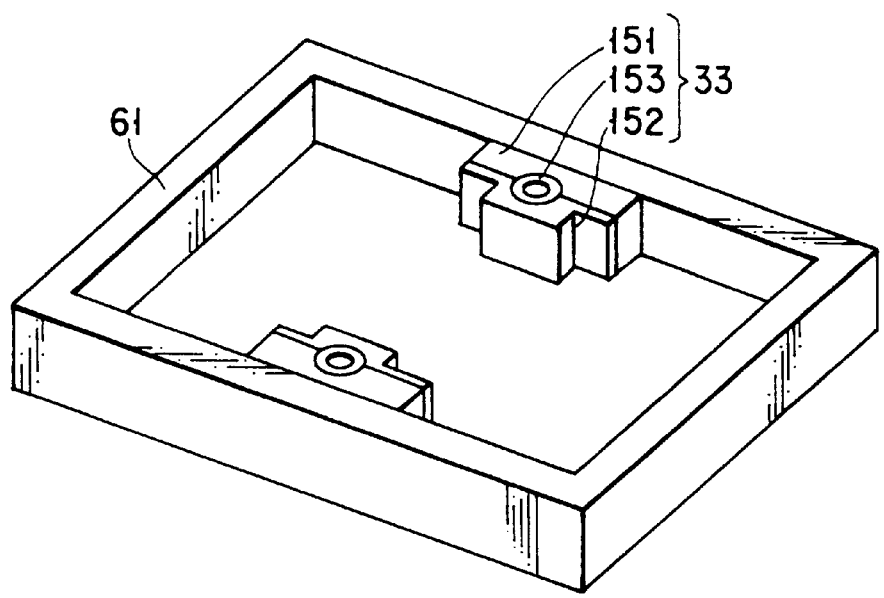
F I G. 11
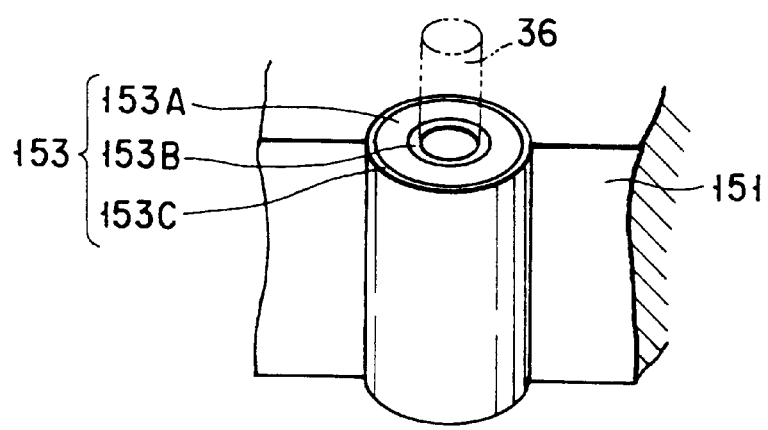
F I G. 12

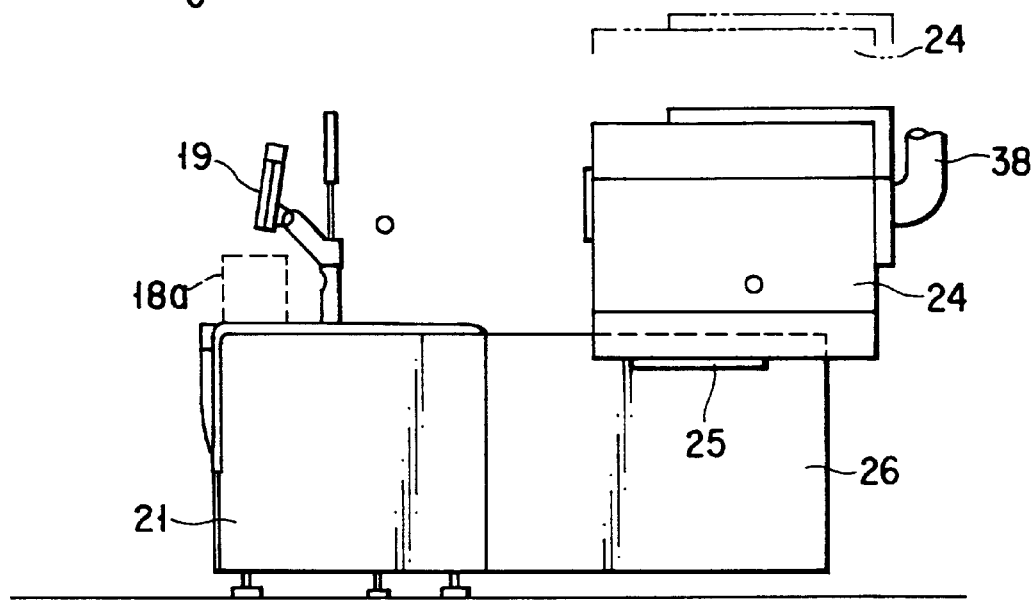
F I G. 14A
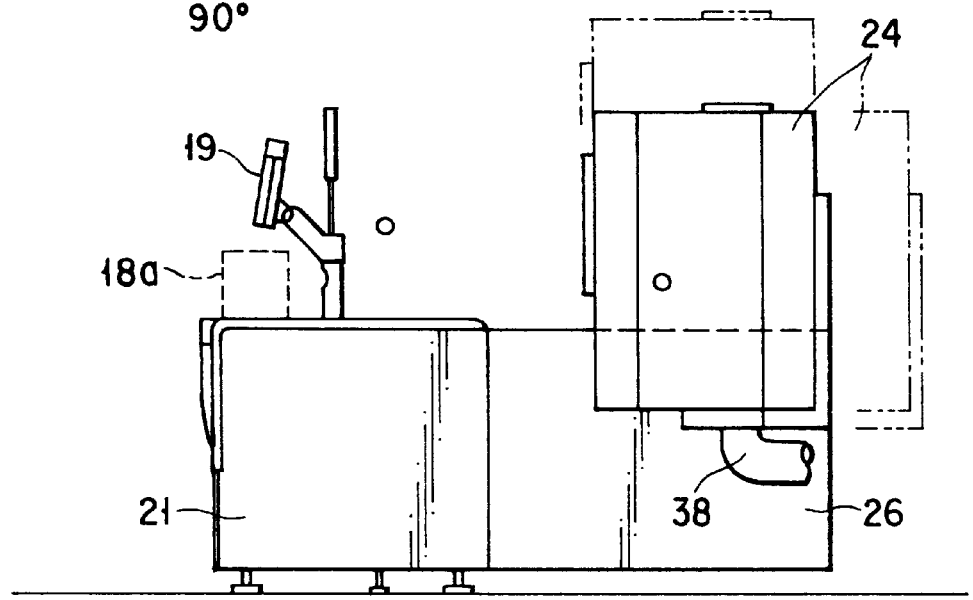
F I G. 14B

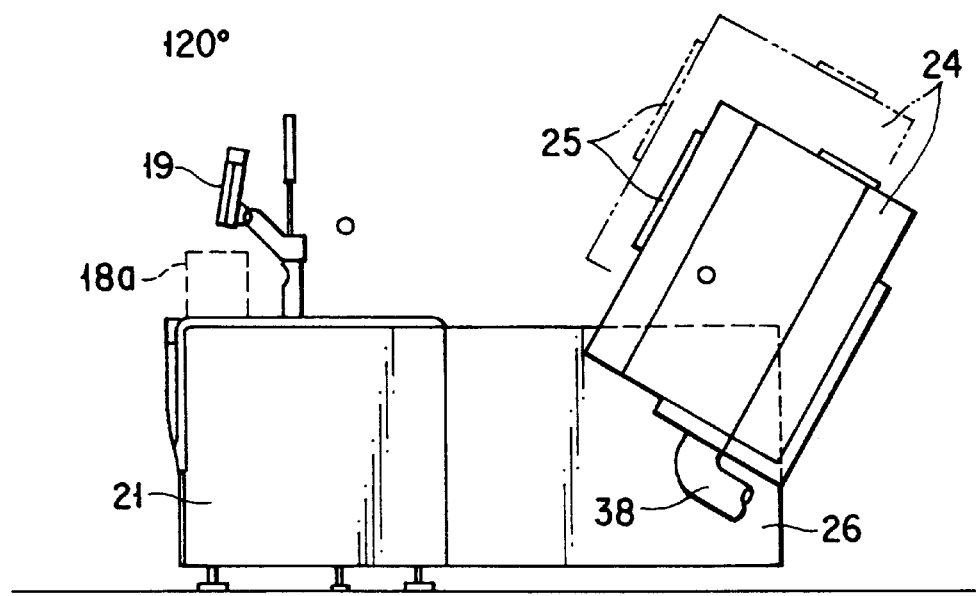
F I G. 14C
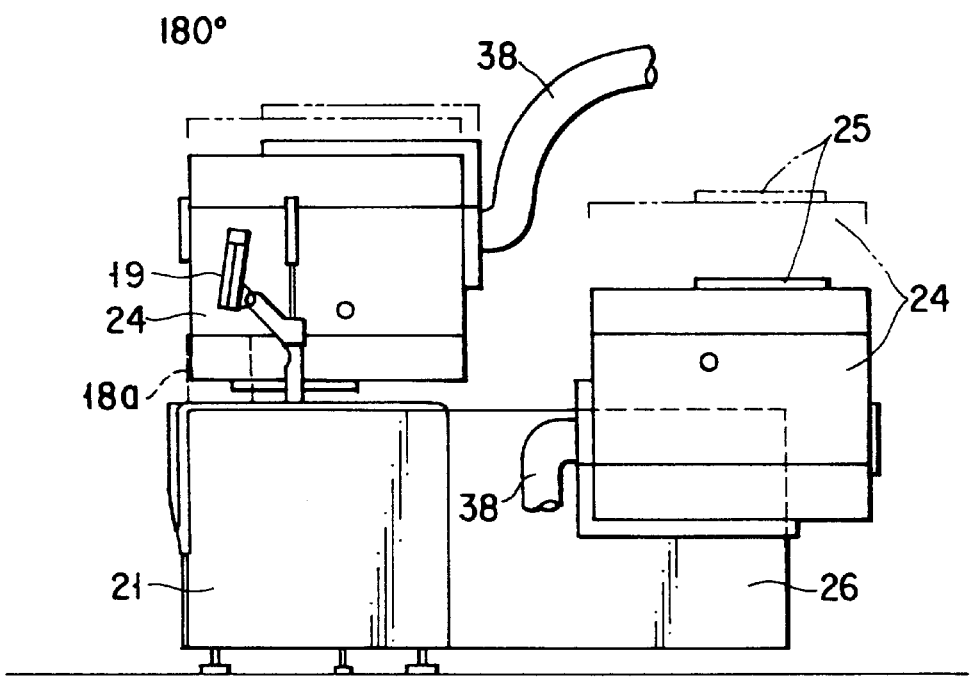
F I G. 14D

PROBE APPARATUS

BACKGROUND OF THE INVENTION

1. Field of the Invention

The present invention relates to a probe apparatus for inspecting objects of inspection, such as packaged logical circuit elements, for electrical properties.

2. Description of the Related Art

As shown in FIG. 15, a probe apparatus A generally comprises a test head D, which can be electrically continuous with a probing card C attached to an apparatus body B, a support E for supporting the head D for rotation, and a rotation drive mechanism F. The mechanism F causes the support E to rotate the head D in a direction such that terminals of the head D come into contact with or separate from terminals of the card C. After the test head D and the probing card C are thus made electrically continuous with each other, an object of inspection, such as a semiconductor wafer W, is inspected for electrical properties.

More specifically, a head plate (not shown) is mounted on the probe apparatus body B by means of, for example, hinges, thus forming a top face of the body B. The head plate can be swung open to the rear side of the apparatus body. An opening is formed substantially in the center of the head plate, and an insert ring (not shown) is attached to the opening. The probing card C is removably attached to the insert ring by means of a card holder. The card C is overlain by the test head D, which is electrically continuous with the card C. The test head D is mounted on one side face of the apparatus body B by means of, for example, a rotating shaft G. In replacing the probing card C or internally inspecting the apparatus body B, for example, the head D is rotated toward the one side face of the apparatus body, as indicated by two-dot chain line in FIG. 15. Thus, the head D is retreated to a position such that it is situated on the rear side of the apparatus body without interfering with the head plate.

The electrical continuity between the test head D and the probing card C is established by means of a performance board H or connecting ring I. The head D contains therein a power source for samples, which applies voltage to an IC chip on the semiconductor wafer, and pin electronics (not shown), which include an input unit for introducing outputs from the IC chip into a measuring unit. The pin electronics are connected electrically with a plurality of electronic component circuits mounted on the performance board H. Terminals of the electronic component circuits are arranged concentrically on the lower surface of the board H, and are pressed against spring probes (not shown) that are arranged concentrically on the upper surface of the connecting ring I, whereby the test head D is made to be electrically continuous with the probing card C.

Thus, in the probe apparatus A constructed in this manner, the test head D is rotated toward the probing card C so that the terminals of the head D are pressed individually against the spring probes of the card C, whereby the head D and the card C are connected electrically with each other.

As the terminals of the rotating test head D are pressed against their corresponding spring probes of the probing card C, however, all the terminals of the head D are not simultaneously pressed against the spring probes. Those terminals whose radii of rotation are relatively short are first pressed against their corresponding spring probes, and those terminals whose radii of rotation are longer are then pressed against their corresponding pins. In other words, the terminals of the test head D are pressed against their corresponding spring probes by priority of the shortness of the radius of rotation. In this process of operation, therefore, those spring probes which are brought into contact with the terminals with shorter radii of rotation are more liable to be damaged by a diagonal force or bending stress. In consequence, an operator must continually check the spring probes for the extent of damage and, if necessary, replace the spring probes.

SUMMARY OF THE INVENTION

The present invention has been contrived in consideration of these circumstances, and its object is to provide a probe apparatus in which terminals of a test head, which is rotatable with respect to an apparatus body, and terminals of the apparatus body can be pressed against one another for electrical continuity or separated with a uniform force, whereby the terminals of the apparatus body can be prevented from being damaged.

The above object of the present invention is achieved by a probe apparatus constructed as follows. The probe apparatus comprises an apparatus body fitted with a probing card having a probe connected electrically with an electrode of an object of inspection, a test head operatively mounted on the apparatus body and electrically continuous with the probe of the probing card, rotating means for rotating the test head, and vertical moving means for vertically raising or lowering the test head.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a perspective view of a probe apparatus according to a first embodiment of the present invention;

FIG. 5 is a perspective view of a probe apparatus according to a second embodiment of the invention;

FIG. 10 is a perspective view schematically showing a lift drive mechanism and a horizontal moving mechanism of the probe apparatus of FIG. 5;

FIG. 11 is a perspective view showing a support frame and a floating mechanism of the probe apparatus of FIG. 5;

FIG. 12 is a perspective view showing the details of the floating mechanism shown in FIG. 11;

FIG. 14A is a right-hand side view of the probe apparatus shown in FIG. 6, showing a state established when the test head is moved at a rotational angle of 0° by the moving mechanism of the probe apparatus of FIG. 5;

FIG. 14B is a right-hand side view of the probe apparatus shown in FIG. 6, showing a state established when the test head is moved at a rotational angle of 90° by the moving mechanism of the probe apparatus of FIG. 5;

FIG. 14C is a right-hand side view of the probe apparatus shown in FIG. 6, showing a state established when the test head is moved at a rotational angle of 120° by the moving mechanism of the probe apparatus of FIG. 5;

FIG. 14D is a right-hand side view of the probe apparatus shown in FIG. 6, showing a state established when the test head is moved at a rotational angle of 180° by the moving mechanism of the probe apparatus of FIG. 5.

DETAILED DESCRIPTION OF THE PREFERRED EMBODIMENTS

Preferred embodiments of the present invention will now be described in detail with reference to the accompanying drawings.

Figure 2A:
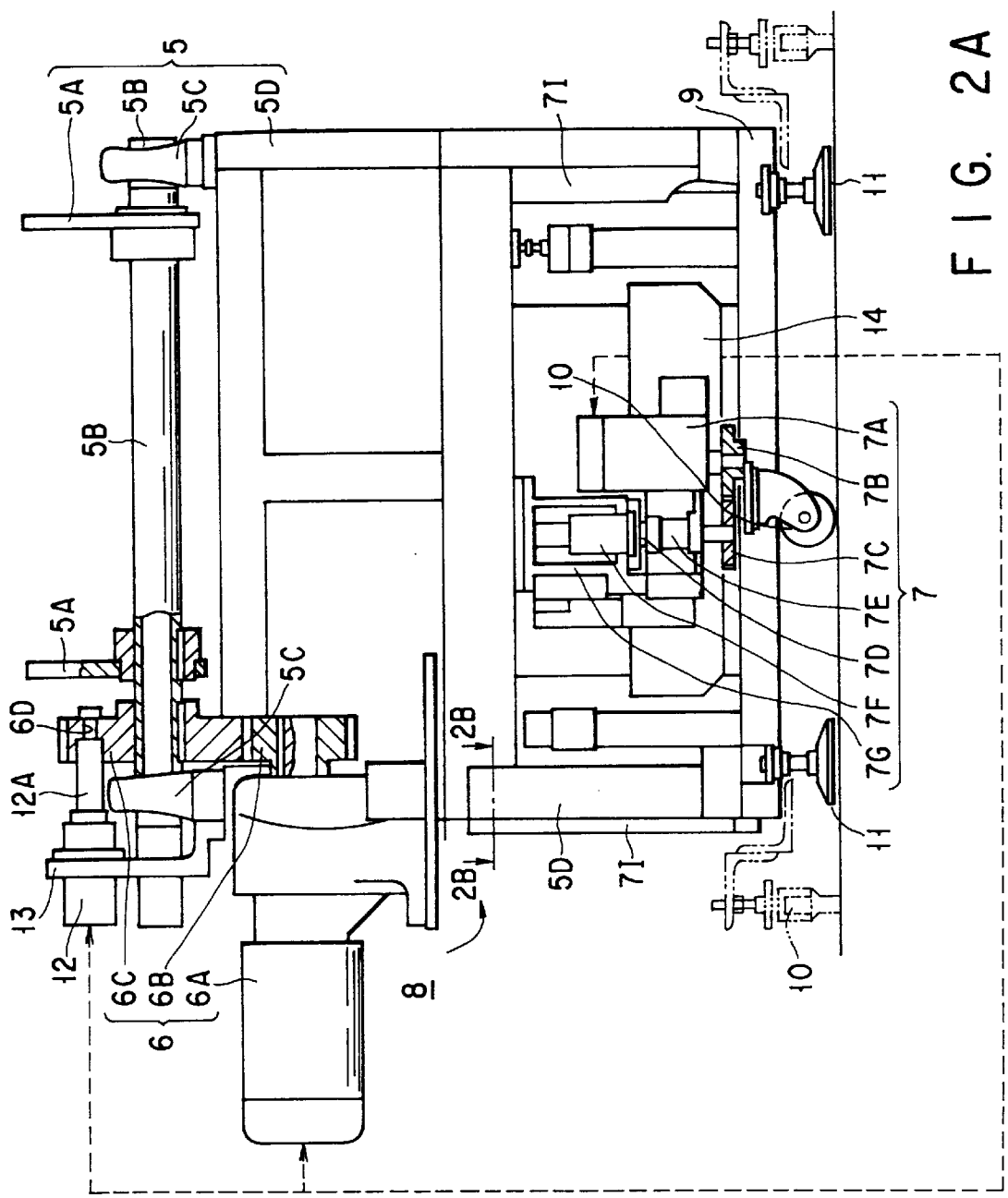
FIG. 2A is a left-hand side view of a test head moving device of the probe apparatus of FIG. 1.
Figure 2B:
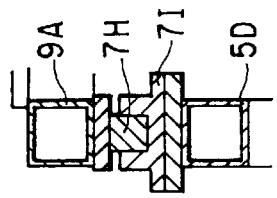
FIG. 2B is a sectional view taken along line 2B—2B of FIG. 2A.
Figure 3:
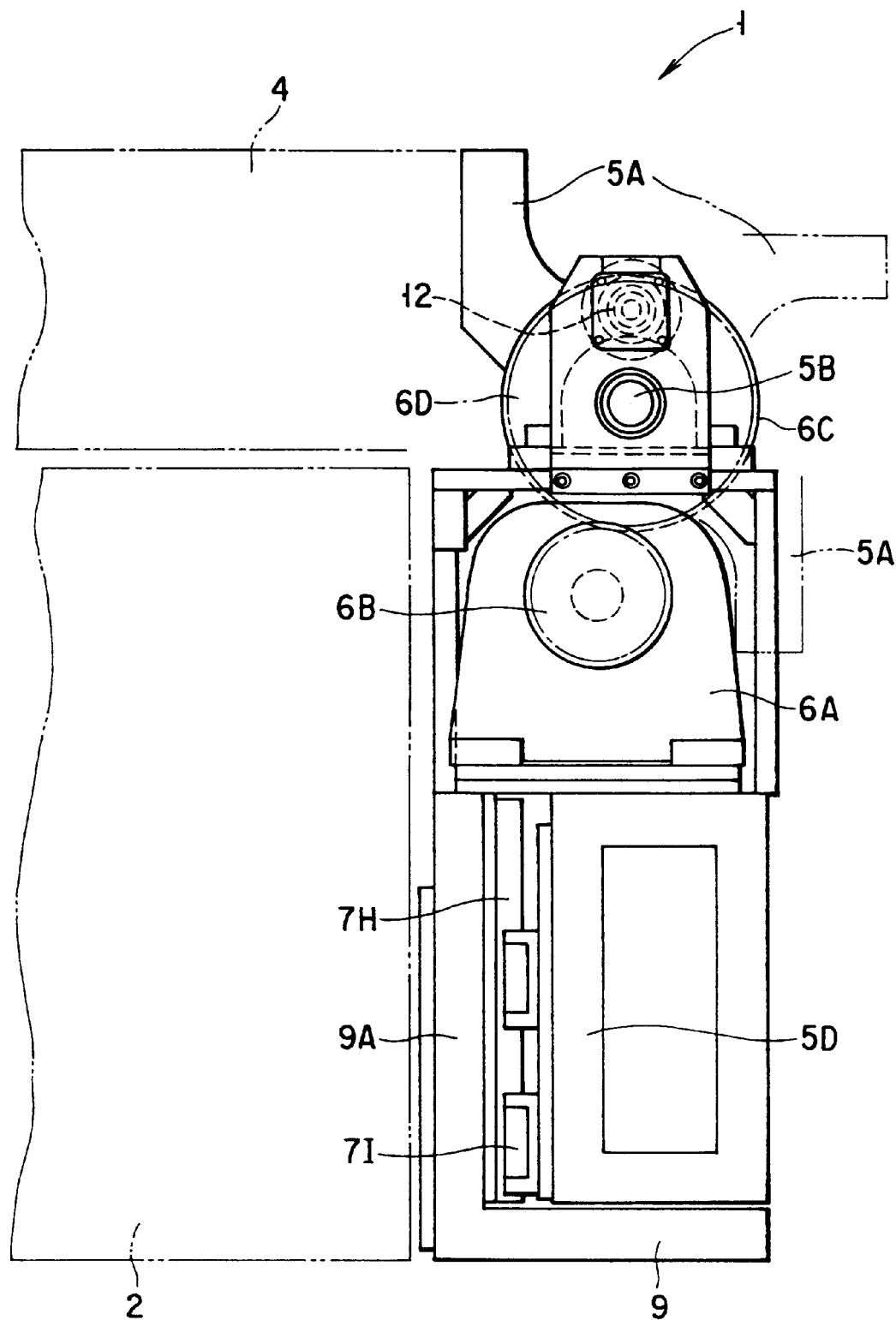
FIG. 3 is a rear view of the test head moving device.
Figure 4:
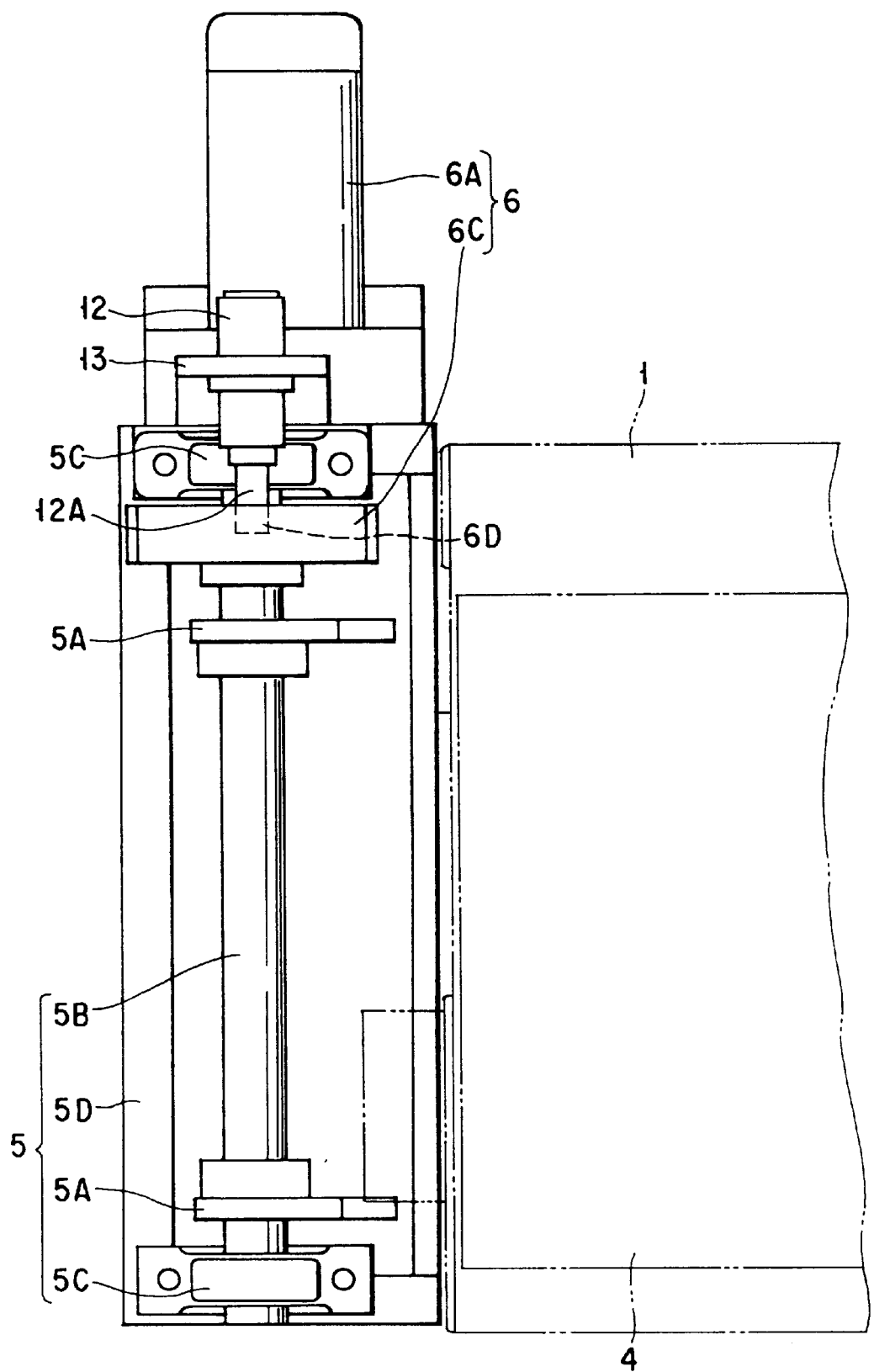
FIG. 4 is a plan view of the test head moving device.

FIGS. 1 to 4 show a first embodiment of the invention. As shown in FIG. 1, a probe apparatus 1 according to the present embodiment comprises a probing card 3, a test head (indicated by two-dot chain line) 4, a movable support 5, and a rotation drive mechanism 6. The probing card 3 is attached to a center opening of a head plate 2A, which constitutes the top plate of an apparatus body 2. The test head 4 has terminals (not shown) that are electrically continuous with contact terminals 3A of the card 3. The movable support 5 supports the head 4 for counterclockwise rotation. The rotation drive mechanism 6 urges the support 5 to rotate the test head 4 toward or away from the card 3. As shown in FIGS. 2 and 3, the probe apparatus 1 further comprises a lift drive mechanism 7, which raises or lowers the test head 4 along with the movable support 5 and the rotation drive mechanism 6. The support 5 and the drive mechanisms 6 and 7 constitute a test head moving device 8 for moving the test head 4 relatively to the probing card 3. The apparatus body 2 is furnished with a cover 18 for a wafer carrier, which contains a predetermined number of objects of inspection, such as semiconductor wafers. The objects are automatically transported from the carrier to an inspection position under the probing card 3.

As shown in FIG. 1, the test head moving device 8 is located adjacent to the left-hand side face of the apparatus body 2, as viewed on the front side, in a separable fashion. Provided under the movable support 5 is a fixed framework 9, which supports the support 5. The support 5 and the framework 9 form a rectangular framework as a whole. A plurality of wheels 10 are attached to the peripheral edge of the lower end of the fixed framework 9. These wheels 10 enable the test head moving device 8 to move independently of the apparatus body 2.

As shown in FIGS. 1 and 2A, for example, the movable support 5 includes a pair of arms 5A coupled to a holder 4A of the test head 4, a hollow rotating shaft 5B fitted with the arms 5A and extending along the overall length of the side face of the apparatus body 2, a pair of pillow-type bearings 5C individually 5 supporting the opposite end portions of the shaft 5B for rotation, and a framework 5D having the bearings 5C fixed on its top face. The framework 5D and the fixed framework 9 constitute a rectangular framework as a whole, which is small enough to be covered by the side face of the apparatus body 2, as shown in FIG. 1. The movable support 5 is raised and lowered above the fixed framework 9 by the lift drive mechanism 7. Fixing legs 11 are attached to the lower surface of the fixed framework 9 in order to fix the test head moving device 8 when the device 8 is positioned with respect to the apparatus body 2.

The rotation drive mechanism 6 is located at the rear end portion (left-hand end portion in FIG. 2A) of the movable support 5. The mechanism 6 is raised or lowered together with the support 5 in the manner mentioned later. As shown in FIG. 2A, for example, the mechanism 6 includes a forwardly directed gear motor 6A with brake, a gear 6B fixed to the shaft of the motor 6A, and a gear 6C fixed to the rear end portion of the rotating shaft 5B and in mesh with the gear 6B. As the motor 6A of the mechanism 6 is driven, the shaft 5B is rotated by means of the gears 6B and 6C, whereby the test head 4, which weighs 260 kg at the maximum, is rotated. Thereupon, the arms 5A rotate clockwise through 90° or 180°, from a position indicated by full line in FIG. 3 to a position indicated by two-dot chain line. As a result, the test head 4 rotates through 90° or 180° from a position in which it faces the apparatus body 2 in parallel relation. In this case, the head 4 rotates through 90° in 11 seconds and through 180° in 22 seconds, for example. It is to be understood that the range and speed of rotation caused by the rotation drive mechanism 6 are not limited to those figures.

As shown in FIG. 2A, an air cylinder 12 for positioning the test head 4 is located on the rear end portion (left-hand end portion in FIG. 2A) of the top face of the framework 5D. The cylinder 12 is supported horizontally by a support member 13, which is mounted on the rear end portion of the framework 5D. In FIG. 2A, the cylinder 12 is situated over the left-hand end of the rotating shaft 5B. The gear 6C, which is fixed to the shaft 5B, is formed with a plurality of holes 6D (e.g., three in number) in which a cylinder rod 12A of the cylinder 12 can be fitted. The holes 6D are arranged at angular intervals of 90°, for example, in the circumferential direction of the gear 6C. Thus, when the air cylinder 12 is driven so that the rod 12A is advanced toward the gear 6C and gets into one of the holes 6D, the test head 4 is located in a predetermined rotational position. When the rod 12A recedes from the gear 6C and gets out of the hole 6D, the gear 6C is released and allows the head 4 to rotate. If the cylinder rod 12A is fitted into any of the holes 6D of the gear 6C when the head 4 is situated parallel to the apparatus body 2, the head 4 is positioned in the horizontal state. When the cylinder rod 12A is caused to recede so that it is disengaged from the hole 6D of the gear 6C, in this state, the test head 4 can be rotated to be separated from the apparatus body 2.

As shown in FIG. 2A, the lift drive mechanism 7 is set on the fixed framework 9. The mechanism 7 comprises, for example, a downwardly directed gear motor 7A with brake, a gear 7B fixed to the shaft of the motor 7A, a gear 7C in mesh with the gear 7B, a ball screw 7D having the gear 7C on its lower end, a bearing 7E supporting the screw 7D for rotation, and a nut 7F overlying the bearing 7E and fitted on the screw 7D. The nut 7F is bolted to the lower surface of an intermediate frame of the framework 5D of the movable support 5 through the medium of a cylindrical framework 7G. As the ball screw 7D is rotated, the nut 7F ascends or descends, thereby raising or lowering the support 5. Thus, the screw 7D, nut 7F, and framework 7G constitute a conversion mechanism for converting the rotatory motion of the gears 7B and 7C into an up-and-down motion. In this case, the lift drive mechanism 7 can raise or lower the test head 4 to a height of 120 mm with a lifting thrust of 800 kg and at a speed of 5 mm/sec in a manner such that the head 4 and the probing card 3 are electrically continuous. It is to be understood that the range and speed of ascent or descent caused by the lift drive mechanism 7 are not limited to those figures.

As shown in FIGS. 2B and 3, a pair of guide rails 7H are arranged vertically in front of and behind the motor 7A and the ball screw 7D, individually. The rails 7H are individually in engagement with engaging members 7I, which are fixed to the framework 5D of the movable support 5. The guide rails 7H are fixed to a vertical post 9A of the fixed framework 9 and extend vertically along the post 9A. When the motor 7A is driven so that the rotatory motion is transmitted to the ball screw 7D via the gears 7B and 7C, the nut 7F ascends or descends along the screw 7D. Thereupon, the movable support 5, which is fixed to the nut 7F, ascends or descends together with the rotation drive mechanism 6 over the fixed framework 9, guided by the guide rails 7H and kept horizontal.

The motors 6A and 7A and the air cylinder 12 are actuated by operating a control panel 19 having a monitor. More specifically, a control device 14 mounted on the fixed framework 9 controls the operations of the motors 6A and 7A or flows of air into the cylinder 12 in response to operating signals from the control panel 19, for example.

The following is a description of the operation of the probe apparatus 1 constructed in this manner.

In the state of FIG. 1 in which the probing card 3 and the test head 4 are electrically continuous with each other, the cylinder rod 12A of the air cylinder 12 is fitted in one of the holes 6D of the gear 6C of the rotation drive mechanism 6, so that the head 4 is locked and prevented from rotating.

When specific operating means on the control panel 19 is operated to release the probing card 3 and the test head 4 from the electrical continuity, the motor 7A of the lift drive mechanism 7 starts to operate. Thereupon, the ball screw 7D is rotated by the gears 7B and 7C, so that the movable support 5, along with the test head 4, is caused to ascend or descend by the nut 7F in engagement with the screw 7D. At this time, the test head 4 moves vertically upward in a horizontal state, thereby receding from the probing card 3, so that all the terminals of the head 4 are simultaneously separated from spring probe (not shown) of the card 3. Thus, the test head 4 can smoothly leave the probing card 3 without applying any undue force to the spring probes. When the test head 4 reaches a predetermined height, thereafter, the motor 7A is stopped.

When the operation of the motor 7A is stopped, the positioning air cylinder 12 is actuated. As a result, the cylinder rod 12A contracts and gets out of the hole 6D of the gear 6C of the rotation drive mechanism 6, whereupon the gear 6C is rendered rotatable. Thereafter, the motor 6A is started, and the rotating shaft 5B of the movable support 5 is rotated through the medium of the gears 6B and 6C.

Thereupon, the test head 4, which is connected to the arms 5A, rotates in a direction such that it moves away from the probing card 3. When the head 4 is rotated through a predetermined angle (e.g., 90° or 180°), the motor 6A is stopped, and the air cylinder 12 is actuated again. As the cylinder 12 is actuated in this manner, the cylinder rod 12A gets into one of the holes 6D of the gear 6C, whereupon the test head 4 is held in a specific rotational position. With the head 4 thus retreated from the position over the apparatus body 2, it is possible to replace the probing card 3 or release the head plate 2A to facilitate internal inspection of the apparatus body 2.

In making the test head 4 and the probing card 3 electrically continuous again in this state, specific operating means on the control panel 19 is operated to actuate the air cylinder 12. As the cylinder 12 is actuated in this manner, the cylinder rod 12A contracts and gets out of the hole 6D of the gear 6C of the rotation drive mechanism 6, whereupon the gear 6C is rendered rotatable. Thereafter, the motor 6A is rotated reversely to the direction for the aforesaid case, and the rotating shaft 5B of the movable support 5 is rotated through the medium of the gears 6B and 6C. Thereupon, the test head 4, having so far been held in the specific rotational position, rotates so as to approach the probing card 3. When the rotated head 4 is situated parallel to the apparatus body 2, the motor 6A is stopped, and the air cylinder 12 is actuated again. As the cylinder 12 is actuated in this manner, the cylinder rod 12A gets into one of the holes 6D of the gear 6C, whereupon the head 4 is kept horizontal. Thereafter, the motor 7A of the lift drive mechanism 7 is rotated reversely to the direction for the aforesaid case, and the ball screw 7D is rotated by the gears 7B and 7C, so that the movable support 5 is lowered together with the test head 4 by the nut 7F, which is in engagement with the screw 7D. At this time, the test head 4 moves vertically downward in a horizontal state, thereby approaching the probing card 3, so that all the terminals of the head 4 are simultaneously pressed against the spring probes of the card 3. Thus, the terminals of the head 4 can be smoothly pressed against their corresponding spring probes without applying any undue diagonal force to the pins. When all the terminals of the test head 4 are pressed fully against the spring probes of the card 3 so that the head 4 and the card 3 are electrically continuous, the motor 7A is stopped.

When the test head 4 and the probing card 3 of the probe apparatus 1 according to the present embodiment are made to be electrically continuous with each other, as described above, the head 4 in the retreated position is rotated by the rotation drive mechanism 6 to a position such that it is off and parallel to the card 3 of the apparatus body 2. Thereafter, the test head 4 is lowered by the lift drive mechanism 7 in a manner such that it is kept parallel to the card 3. Thus, all the terminals of the head 4 are simultaneously pressed against their corresponding spring probes of the probing card 3, so that the spring probes are subjected to a uniform force, and therefore, can be prevented from being damaged by an undue diagonal force (bending stress). Accordingly, the spring probes need not be partially replaced, so that maintenance operation is eased, and the efficiency of inspection is improved considerably. This effect can be also obtained in replacing the probing card 3 or releasing the test head 4 and the card 3 from the electrical continuity, in order to inspect the apparatus body 2 internally. Thus, in retreating the test head 4 from the apparatus body 2, according to the apparatus 1 of the present embodiment, the head 4 is temporarily raised in a horizontal state from the apparatus body 2, and is then rotated so as to move away from the body 2 by the rotation drive mechanism 6. Since all the terminals of the head 4 are simultaneously disengaged from the spring probes of the probing card 3, therefore, the force of pressure can be removed without subjecting the pins to any bending stress, so that the pins can be prevented from being damaged.

Since the rotation drive mechanism 6 of the probe apparatus 1 according to the present embodiment is provided with the motor 6A and the gears 6B and 6C for transmitting the rotatory force of the motor 6A, the test head 4 can be rotated to any desired angular position at a constant speed. Moreover, the lift drive mechanism 7 is provided with the motor 7A, the gears 7B and 7C for transmitting the rotatory force of the motor 7A, and the ball screw 7D and the nut 7F for converting the rotatory motion of the gears 7B and 7C into an up-and-down motion. Thus, the distance of ascent or descent of the test head 4 can be accurately controlled, and the head 4 can be raised to any desired position. If the test head 4 is raised by means of the lift drive mechanism 7, therefore, the apparatus body 2 can be internally inspected without rotating the head 4 by means of the rotation drive mechanism 6.

Figure 6:
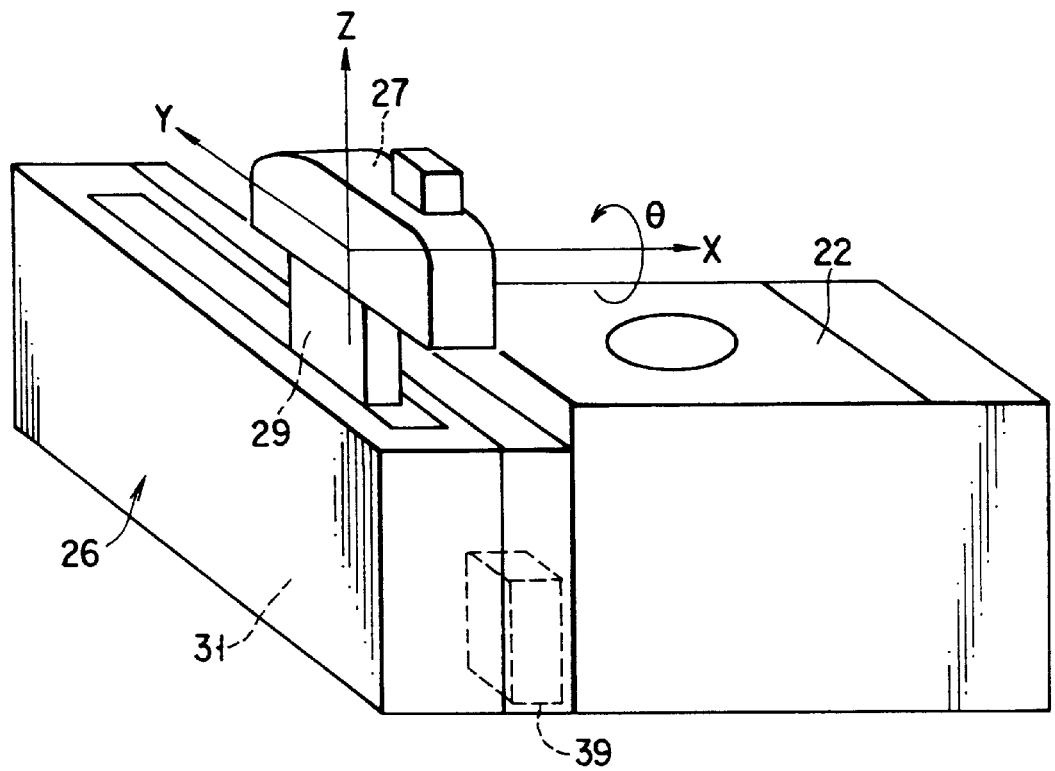
FIG. 6 is a schematic perspective view of the probe apparatus of FIG. 5, illustrating the directions of movement of a test head caused by a moving mechanism.
Figure 7:
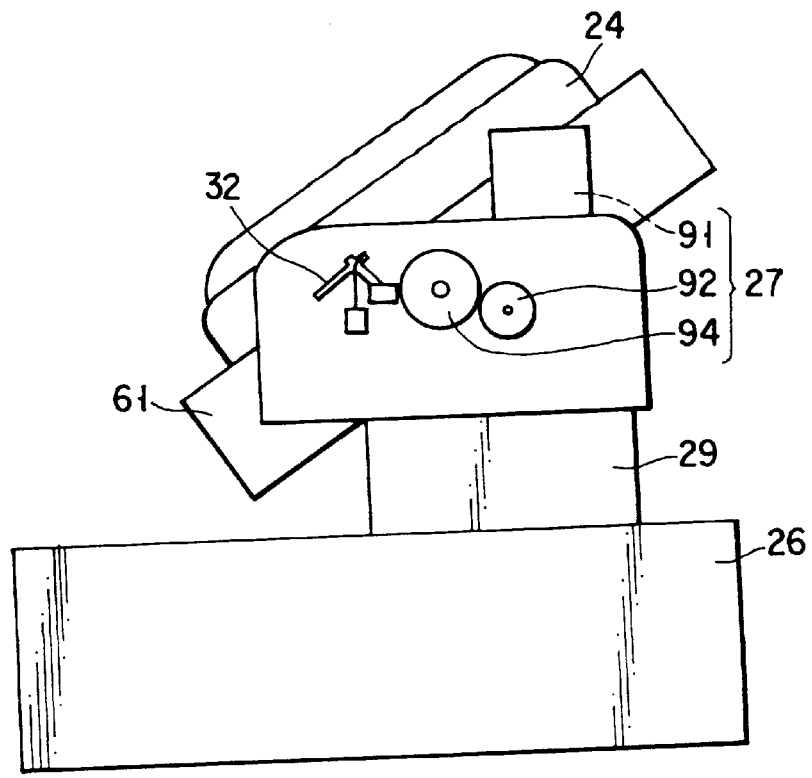
FIG. 7 is a schematic view showing the test head rotated by a rotation drive mechanism of the probe apparatus of FIG. 5.

FIGS. 5 to 14 show a second embodiment of the present invention. As shown in FIGS. 5 to 7, a probe apparatus according to the present embodiment comprises a probing card 23, removably attached to (e.g., screwed into) a head plate 22 of a apparatus body 21, and a test head 24 overlying the card 23. Arranged on the down side of the probing card 23 is a probe train, which is adapted to be electrically in contact with an electrode pad of an object of inspection, e.g., semiconductor wafer (not shown). The test head 24 has terminals, which are adapted to be electrically in contact with the probe train (probe needle train) of the card 23, and is connected to an IC tester (not shown). According to this arrangement, the semiconductor wafer, which is electrically in contact with the probe train, can be checked for electrical characteristic by means of the IC tester by making the terminals of the test head 24 and the probe train (probe needle train) of the probing card 23 electrically continuous.

The test head 24 contains therein an output circuit, which applies predetermined test signals from the IC tester to an IC chip formed on the semiconductor wafer, and pin electronics (not shown), which include an input unit for introducing outputs from the IC chip into a measuring unit, such as the IC tester, in response to the test signals. The pin electronics are connected electrically with a plurality of electronic component circuits mounted on a performance board 25 that is connected electrically with the probing card 23. Terminals of the electronic component circuits are arranged concentrically on the board 25, and are pressed against spring probes that are arranged on the upper surface of a connecting ring (not shown) attached to the card 23. Thus, as described in connection with the first embodiment, the test head 24 is made to be electrically continuous with the probing card 23 by means of the performance board 25 and the connecting ring.

The number of the terminals of the test head 24 is set so as to be able to cope with innumerable inspection items for the inspection of highly integrated large-diameter semiconductor wafers. The head 24 is ultraheavy, weighing about 500 kg, for example.

As shown in FIGS. 5 to 7, the probe apparatus of the present embodiment is provided with a moving mechanism 26 for moving the test head 24, which is connected to the IC tester, in a longitudinal direction (Y-direction), vertical direction (Z-direction), and θ-direction, for example, on one side face of the apparatus body 21. The moving mechanism 26 includes a rotation drive mechanism 27 for reversibly rotating the test head 24, a lift drive mechanism 29 for raising or lowering the head 24, and a horizontal moving mechanism 31 for horizontally moving the head 24. The rotation drive mechanism 27 is contained in an upper housing C1' of a first casing C1, which extends vertically. The horizontal moving mechanism 31 and the lift drive mechanism 29 are contained in a second casing C2, which extends horizontally backward from the front face of the apparatus body 21 along one side face thereof, and the lower portion of the first casing C1, respectively. A support frame 61, which supports the test head 24, is rotated with respect to the first casing C1 by the rotation drive mechanism 27, the upper housing C1' of the first casing C1 is raised or lowered by the lift drive mechanism 29, and the first casing C1 is horizontally moved with respect to the second casing C2 by the horizontal moving mechanism 31. More specifically, the rotation drive mechanism 27 supports the test head 24 like a cantilever with the aid of the support frame 61, and reversibly rotates the test head 24 in the θ-direction around its supporting portion, over the apparatus body 21 and the probing card 23, as shown in FIGS. 6 and 7. The lift drive mechanism 29 raises or lowers a first support 28 (see FIG. 10), which supports the rotation drive mechanism 27, that is, the upper housing C1' of the first casing C1, thereby vertically moving the test head 24. The horizontal moving mechanism 31 horizontally moves a second support 30 (see FIG. 10), which supports the lift drive mechanism 29, with respect to the second casing C2, thereby causing the test head 24 to reciprocate along one side of the apparatus body 21, within a horizontal plane between regions in front of and behind the apparatus body 21. Each of the supports 28 and 30, which are partially shown in FIG. 10, is substantially in the form of a latticed frame, each apparatus is fixed by using each frame.

Figure 8:
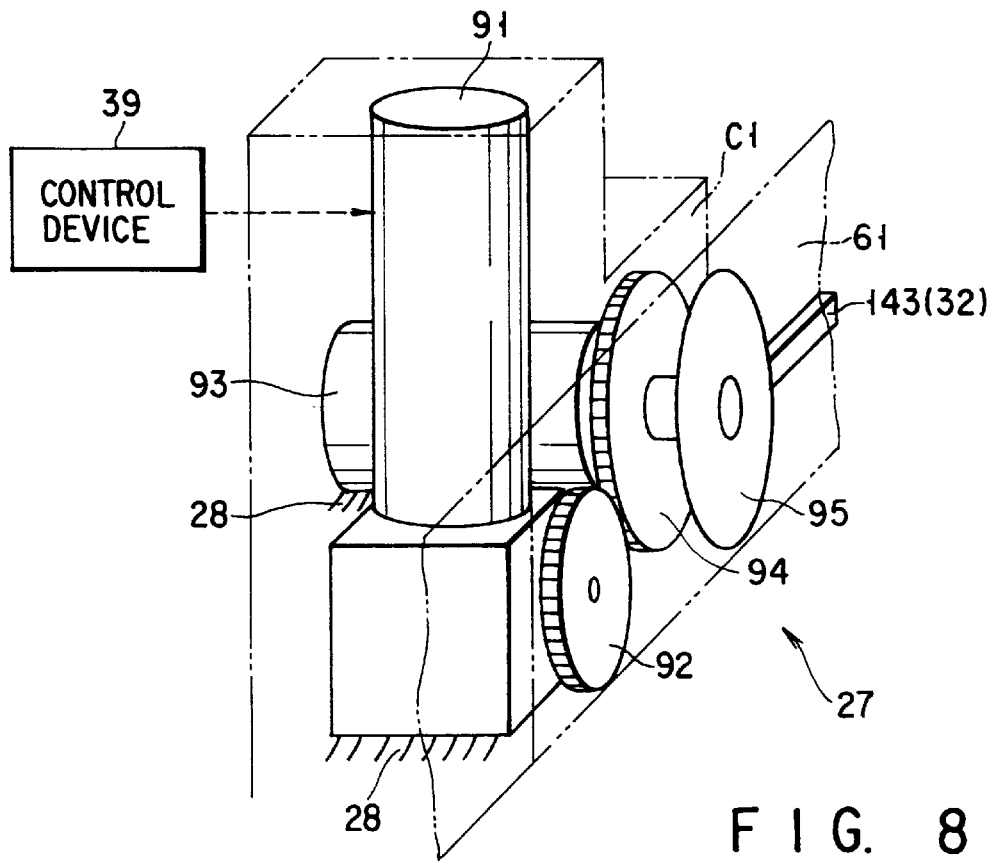
FIG. 8 is a perspective view schematically showing the rotation drive mechanism.

As shown in FIG. 8, the rotation drive mechanism 27 includes a motor 91 fixed to the first support 28, a small gear 92 fixed to the shaft of the motor 91, and a large gear 94 in mesh with the gear 92 and fixed to a rotating shaft, which is pivotally supported by a bearing 93. The large gear 94 is coupled with the support frame 61, which supports the test head 24, by means of a coupling member 95. As the support frame 61 rotates accompanying the rotation of the large gear 94, therefore, the test head 24 rotates in the forward or reverse direction. In order to reduce the turning moment of the test head 24 to minimize the torque of rotation of the head 24, in this case, an extension of the rotating shaft of the large gear 94 is made to pass near the center of gravity of the head 24, so that the distance between the center of rotation and center of gravity of the head 24 is adjusted to zero or minimized. Thus, the test head 24 rotates around an axis on or near its center of gravity. The head 24 rotates at a speed of 180° per 30 seconds.

Figure 9:
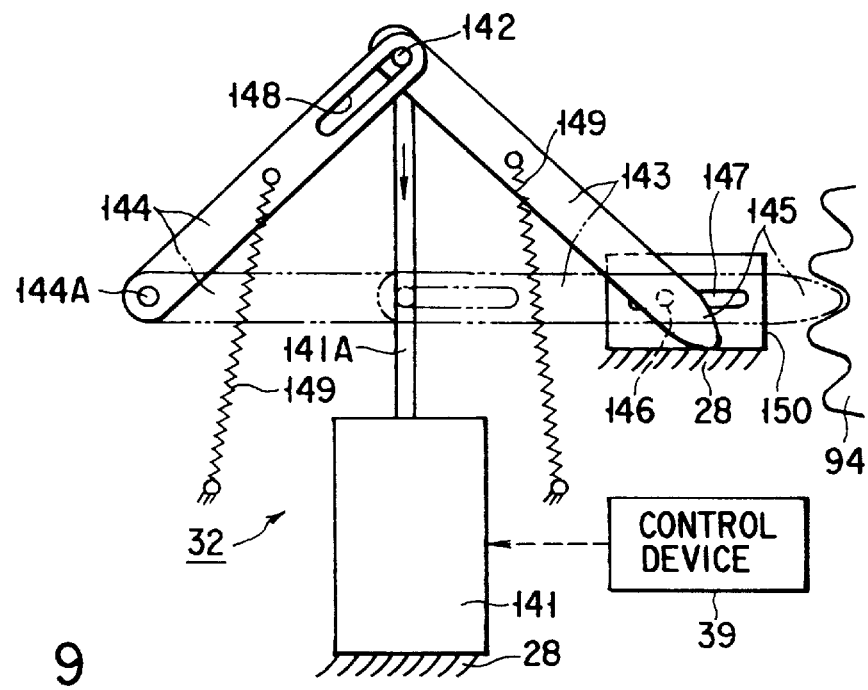
FIG. 9 is a view showing an arrangement of a locking mechanism for locking the rotation drive mechanism of FIG. 8.

The first support 28 is provided with a locking mechanism 32 for fixing the large gear 94 of the rotation drive mechanism 27, that is, the test head 24, in any desired rotational position. As shown in FIG. 9, the locking mechanism 32 includes an air cylinder 141 and a pair of flat bars 143 and 144. One end of each flat bar is connected to a pin 142 that is attached to a cylinder rod 141A of the cylinder 141.

The left-hand end of the right-hand flat bar 143 is rockably in engagement of the pin 142. A locking claw 145 is formed on the right-hand end of the bar 143. The claw 145 is adapted to engage the teeth of the large gear 94, as indicated by dashed line, when in a locked state. The right-hand flat bar 143 has a roller 146 for guiding it in movement, in the vicinity of the locking claw 145. The roller 146 is fitted in a horizontally elongated guide groove 147 of a guide member 150, which is fixed to the first support 28, whereby the moving direction of the bar 143 is regulated.

A longitudinally extending slot 148 is formed in the right-hand end portion of the left-hand flat bar 144, and the pin 142 is fitted in the slot 148. As the cylinder rod 141A of the air cylinder 141 extends or contracts, therefore, the pin 142 moves along the slot 148. The left-hand end of the bar 144 is pivotally mounted on a pin 144A that is fixed to the first support 28. The first support 28 and the flat bars 143 and 144 are coupled to one another by means of a pair of springs 149. The springs 149 continually urge their corresponding flat bars 143 and 144 in a direction opposite to the direction in which the cylinder rod 141A extends or is pushed up by the air cylinder 141.

Thus, according to the locking mechanism 32 constructed in this manner, when the air cylinder 141 is actuated so that the cylinder rod 141A extends, as indicated by full line in FIG. 9, the left-hand flat bar 144 rotates counterclockwise around the pin 144A at its left-hand end. At the same time, the roller 146 of the right-hand flat bar 143 moves to the left in the guide groove 147, so that the bar 143 is lifted up. Thereupon, the locking claw 145 of the bar 143 is disengaged from the teeth of the large gear 94, so that the rotation drive mechanism 27 is unlocked. When the air cylinder 141 is exhausted of compressed air, on the other hand, the flat bars 143 and 144 are pulled down to a horizontal (straight) state, as indicated by dashed line in FIG. 9, by the springs 149, so that the locking claw 145 engages the large gear 94. Accordingly, the rotation of the test head 24 by the rotation drive mechanism 27 is prevented, so that the head 24 is held in the current rotational position.

As shown in FIG. 10, the lift drive mechanism 29 includes a motor 111 for lift drive attached to the second support 30, a first gear 112 for transmission fixed to the shaft of the motor 111, and a second gear 113 for transmission in mesh with the first gear 112. The mechanism 29 further includes a ball screw 114, which is fixedly connected to the shaft of the second gear 113 and can rotate integrally therewith, and a nut member 115, which is fixed to the first support 28 and mates with the screw 114. The ball screw 114 is rotatably supported by a bearing 118, which is fixed to the second support 30. The second support 30 is provided with a pair of guide rails 116, which extend vertically, while the first support 28 is fitted with engaging members 117, which are in engagement with each guide rail 116. Thus, when the motor 111 rotates, this rotatory motion is transmitted to the ball screw 114 via the first and second gears 112 and 113, and the nut member 115 ascends or descends along the screw 114. Thereupon, the first support 28, which is integral with the nut member 115, moves vertically along the guide rails 116 or the second support 30. The lift drive mechanism 29 causes the test head 24 to move up and down at a speed of, for example, 300 mm per 60 seconds.

The horizontal moving mechanism 31 includes a motor 131 mounted on the second support 30, a pinion 132 fixedly coupled to the shaft of the motor 131, and a rack 133 in mesh with the pinion 132. The rack 133 extends horizontally along the inner surface of the second casing C2. The rack 133 is overlain by a pair of guide rails 134, which are spaced and extend parallel to the rack 133. Each rail 134 has a length that substantially covers overall length of the second casing C2, while the rack 133 has a length such that the first casing C1 can be moved throughout the length of the second casing C2. Each guide rail 134 is in engagement with an engaging member (not shown), which is attached to the second support 30. Thus, when the motor 131 rotates, the first and second supports 28 and 30 reciprocate horizontally along the guide rails 134 by the agency of the combination of the pinion 132 and the rack 133. In this case, the test head 24 moves horizontally at a speed of, for example, 1,000 to 1,500 mm per 40 seconds, depending on its own weight, and preferably at 1,295 mm per 40 seconds.

As mentioned before, the moving mechanism 26, which include the motors as drive sources, moves the test head 24 through the medium of the support frame 61. In order to prevent vibrations of the drive sources from being transmitted to the head 24, a precision device, therefore, a floating mechanism 33 is incorporated in the support frame 61.

The floating mechanism 33, which is shown in FIGS. 11 and 12, is constructed as a system which connects the test head 24 and the support frame 61 or renders the head 24 floating. As shown in FIG. 11, the floating mechanism 33 includes a pair of guide blocks 151 and 152 and a cylindrical rubber vibration insulator 153 sandwiched between the blocks 151 and 152. As shown in FIG. 12, the insulator 153 is composed of a cylindrical rubber member 153A and metallic cylindrical members 153B and 153C, which cover the inner and outer peripheral surfaces of the rubber member 153A, respectively. The vibration insulator 153 serves to absorb vibrations from the support frame 61 lest the vibrations be transmitted to the test head 24.

Figure 13:
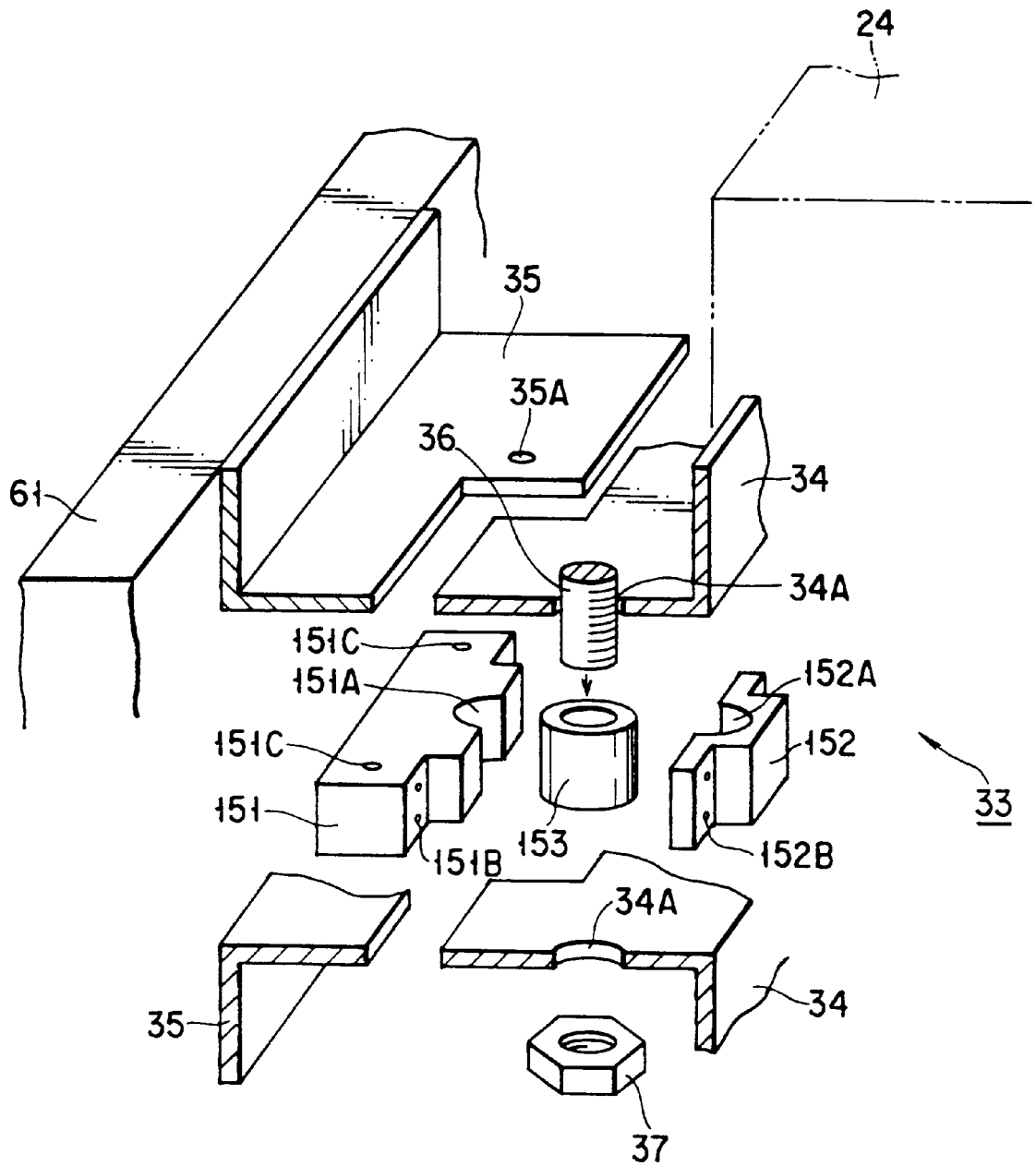
FIG. 13 is an exploded perspective view showing the floating mechanism shown in FIG. 11 and mounting members therefor.
Figure 15:
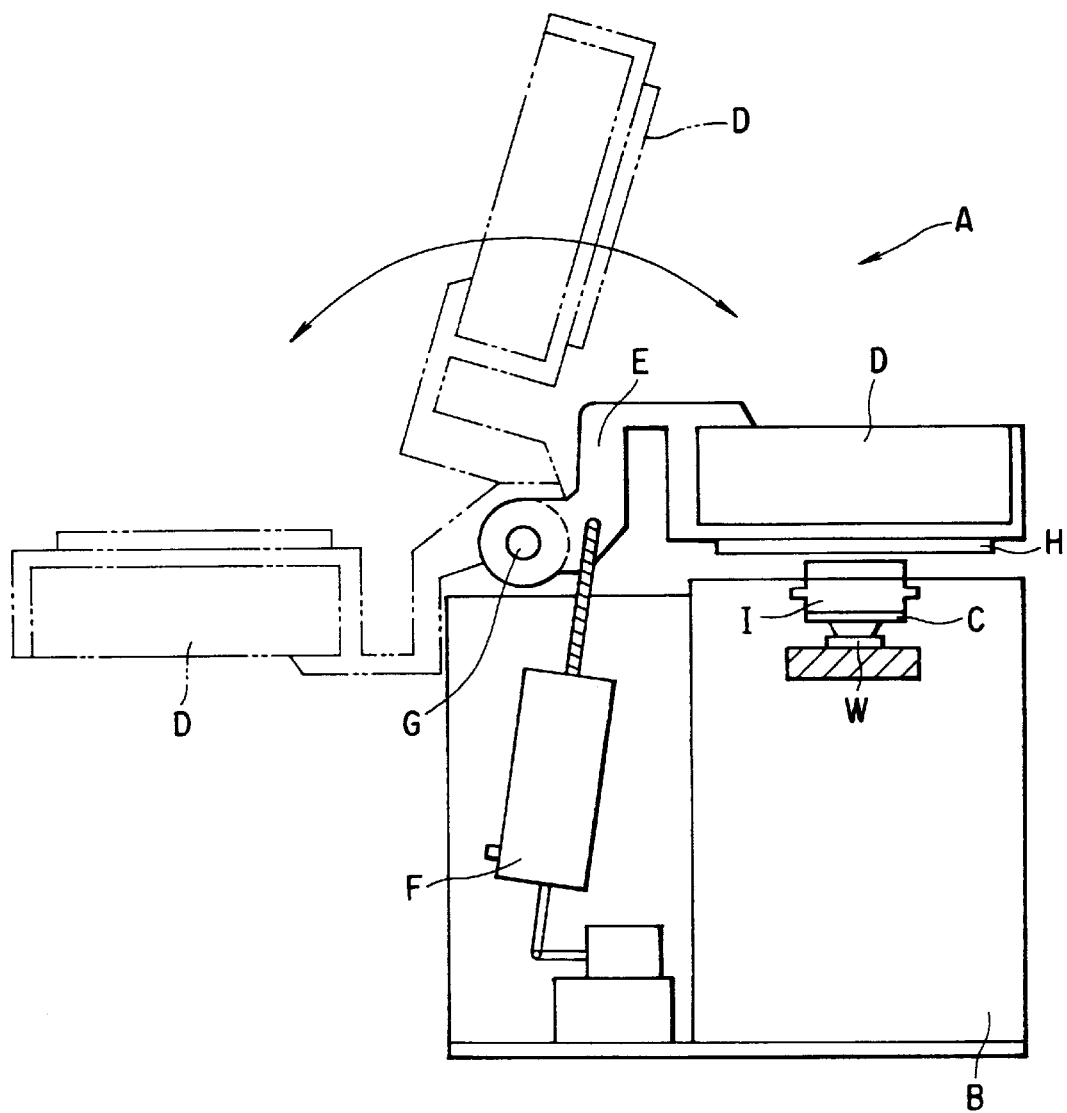
FIG. 15 is a perspective view of a probe apparatus according to prior art.

As shown in FIG. 13, the guide blocks 151 and 152 constitute a split structure, having arcuate surfaces 151A and 152A, respectively, such that the blocks can come into contact with the rubber vibration insulator 153, thereby holding it from both sides. A pair of L-steel members 34, upper and lower facing each other, are fixed to a side face of the test head 24. Likewise, a pair of L-steel members 35, upper and lower facing each other, are fixed to the inner surface of the support frame 61. The guide block 151 is fixed between the L-steel members 35 by passing bolts (not shown) through bolt holes 35A and 151C in the members 35 and the block 151 and tightening them by means of nuts (not shown). The guide block 152 is attached to the guide block 151 by passing bolts (not shown) through lateral bolt holes 152B and 151B in the blocks 152 and 151 and tightening them by means of nuts (not shown), with the rubber vibration insulator 153 interposed between the blocks 152 and 151. The test head 24 is supported floating on the support frame 61 by means of the L-steel members 34 and the floating mechanism 33 by passing a bolt 36 through bolt holes 34A in the members 34 and a center hole of the vibration insulator 153 and tightening it by means of a nut 37, with the floating mechanism 33 situated between the members 34. If the support frame 61 is vibrated by the moving mechanism 26, according to this arrangement, the vibration is absorbed by the rubber member 153A of the vibration insulator 153, and cannot be transmitted to the test head 24.

According to the present embodiment, the motors 91, 111 and 131 and the air cylinder 141 are actuated by operating a control panel 19 (see FIG. 14; not shown in FIGS. 5 to 7) having a monitor. More specifically, a control device 39 (see FIGS. 5 and 6) controls the operations of the motors 91, 111 and 131 or flows of air into the cylinder 141 in response to operating signals from the control panel 19, for example. The apparatus body 21 is furnished with a wafer carrier 18a (see FIG. 14; not shown in FIGS. 5 to 7), which contains a predetermined number of objects of inspection, such as semiconductor wafers. The objects are automatically transported from the carrier 18a to an inspection position under the probing card 23.

Referring now to FIGS. 14A to 14D, maintenance for the probe apparatus according to the present embodiment will be described. In these drawings, each circle represents the center of gravity of the test head 24, and numeral 38 denotes an air duct.

In replacing the probing card 23 in the probe apparatus of the present embodiment, the lift drive mechanism 29 shown in FIG. 10 should be first actuated to move the test head 24 to a position above the apparatus body 21. More specifically, the motor 111 of the mechanism 29 is actuated by operating specific operating means on the control panel 19. Thereupon, the ball screw 114 is rotated by the first and second gears 112 and 113, and the first support 28 is caused to ascend along the guide rails 116 by the nut member 115 in engagement with the screw 114. As the first support 28 ascends in this manner, the test head 24 is raised for a desired distance (e.g., 120 mm) by the support frame 61, which is coupled to the rotation drive mechanism 27 on the first support 28, as shown in FIG. 5. Thus, the head 24 and the probing card 23 are released from electrical continuity. At this time, the test head 24 moves vertically upward in a horizontal state, thereby leaving the card 23, so that all the terminals of the head 24 are simultaneously separated from the spring probes (not shown) of the card 23. Thus, the test head 24 can be smoothly disengaged from the probing card 23 without applying any undue force to the pins.

When the horizontal moving mechanism 31 shown in FIG. 10 is then actuated in this state, the test head 24 is retreated behind the apparatus body 21. More specifically, the motor 131 of the mechanism 31 is actuated by operating specific operating means on the control panel 19. Thereupon, the pinion 132, which is in mesh with the rack 133, rotates, the second support 30 moves horizontally along the guide rails 134, and the test head 24 moves horizontally backward for a desired distance (e.g., 1295 mm), thereby retreating behind the apparatus body 21. When the lift drive mechanism 29 is actuated again in this state, the head 24 lowers for a predetermined distance (e.g., 300 mm) from the position indicated by two-dot chain line in FIG. 14A, so that its center of gravity lowers. Thereupon, the head 24 is in its stable state indicated by full line in FIG. 14A. As a result, the test head 24 is widely separated backward from the apparatus body 21 and stabilized, so that the probing card 23, situated substantially in the center of the head plate 22, can be replaced by lifting up the plate 22 to open the apparatus body 21. After the replacement of the card 23 is finished, the head plate 22 is lowered to close the top of the apparatus body 21, and the head 24 is restored to the inspection position by means of the moving mechanism 26.

The following operation is carried out, for example, in the case where the test head 24 of the probe apparatus of the present embodiment must be brought to the vertical state shown in FIG. 14B for the purpose of maintenance. After the lift drive mechanism 29 shown in FIG. 10 is first actuated to raise the test head 24 for 120 mm from the apparatus body 21, the horizontal moving mechanism 31 is actuated to move the head 24 horizontally backward for 975 mm. In this state, the air cylinder 141 of the locking mechanism 32 shown in FIG. 9 is actuated so that its cylinder rod 141A pushes up the pin junction between the flat bars 143 and 144 to the position indicated by full line in FIG. 7. Thereupon, the locking claw 145 is disengaged from the large gear 94 of the rotation drive mechanism 27, so that the mechanism 27 is unlocked. In this state, the motor 91 of the mechanism 27 shown in FIG. 8 is then actuated to rotate the large gear 94 through the medium of the small gear 92, whereby the test head 24 is rotated through 90° around the shaft of the gear 94 through the medium of the support frame 61, which is coupled to the gear 94. Thereafter, the locking mechanism 32 shown in FIG. 9 is actuated again to lock the head 24, thereby keeping it in a vertical state. Further, the lift drive mechanism 29 shown in FIG. 10 is actuated to lower the test head 24 in the vertical state for 300 mm from the position indicated by two-dot chain line in FIG. 14B to the position indicated by full line. In this state, an operator can carry out maintenance operation, for example, for the performance board 25 in a comfortable position. If necessary, moreover, the horizontal moving mechanism 31 shown in FIG. 10 is actuated to retreat the test head 24 for 320 mm, for example, to the position indicated by another two-dot chain line in FIG. 14B. If the cover of the head 24 is removed in this state, the head 24 can be inspected from both sides.

The following operation is carried out, for example, in replacing the performance board 25 of the probe apparatus of the present embodiment. First, the lift drive mechanism 29 shown in FIG. 10 is actuated to raise the test head 24 for 120 mm from the apparatus body 21. Then, the horizontal moving mechanism 31 is actuated to move the head 24 backward for 975 mm. After the locking mechanism 32 shown in FIG. 9 is unlocked, moreover, the rotation drive mechanism 27 shown in FIG. 10 is actuated to rotate the head 24 through 90°, and the mechanism 27 is locked again by means of the locking mechanism 32. After the horizontal moving mechanism 31 is actuated again to move the test head 24 backward for 320 mm, the head 24 is further rotated through 30° in the same direction by means of the rotation drive mechanism 27. Thereupon, the test head 24 is situated in the position at an angular distance of 120° from its initial position, as shown in FIG. 14C. Furthermore, the head 24 is moved from the position indicated by two-dot chain line in FIG. 14C to the position indicated by full line by means of the lift drive mechanism 29. By doing this, the operator can take an easy position for the replacement of the performance board 25. If the test head 24 is subjected to a 90° rotation in place of the additional 30° rotation for the state shown in FIG. 14C, it can be situated in the position at an angular distance of 180° from its initial position, as shown in FIG. 14D. This position is a convenient position for the maintenance operation.

This series of operations is executed automatically in accordance with predetermined programs. More specifically, these operations can be automated by programming operation modes for the aforesaid drive mechanisms into a microcomputer of the control device 39.

In the probe apparatus according to the present embodiment, as described above, the test head 4 is raised or lowered by the lift drive mechanism 29 in a manner such that it is kept parallel to the probing card 23. Thus, all the terminals of the head 4 are simultaneously pressed against their corresponding spring probes of the card 23, so that the spring probes are subjected to a uniform force, and therefore, can be prevented from being damaged by an undue diagonal force (bending stress). Accordingly, the spring probes need not be partially replaced, so that maintenance operation is eased, and the efficiency of inspection is improved considerably.

In the probe apparatus of the present embodiment, moreover, the test head 24 can be smoothly reversed or moved back and forth or up and down by operating the moving mechanism 26 in the aforementioned manner. Even though the test head 24 is rendered ultraheavy, due to the tendency toward large-sized, highly integrated semiconductor wafers, therefore, it can be steadily smoothly moved to a desired position, e.g., a convenient position for highefficiency maintenance operation. Thus, the safety of the maintenance operation or the like can be secured, and the installation space can be saved.

Since the probe apparatus of the present embodiment is provided with the locking mechanism 32 for locking the rotation drive mechanism 27, the test head 24 can be locked in any desired rotational position, so that it can be held in any inclined state, depending on the maintenance operation.

According to the probe apparatuses of the embodiments described herein, the probing card is expected to be replaced by the operator. However, the present invention may be also applied to a probe apparatus in which the probing card can be replaced automatically. Although the probe apparatuses according to the foregoing embodiments are used to inspect semiconductor wafers, the invention may be also applied to a probe apparatus which is adapted for the inspection of LCD substrates.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A probe apparatus comprising:

an apparatus body fitted with a probing card having a probe configured for electrical connection with an electrode of an object of inspection;

a test head rotatably mounted on the apparatus body for rotation about an axis, said test head including a plurality of terminals configured to electrically communicate with the probe of the probing card;

rotating means for rotating the test head about said axis; and first moving means for raising or lowering the test head along a direction substantially perpendicular to said axis, said direction oriented such that said plurality of terminals engage substantially simultaneously with said probe when said test head is lowered by said first moving means.

2. A probe apparatus according to claim 1, wherein said first moving means vertically raises or lowers the test head over the probing card, with respect to the apparatus body wherein said probing card is provided in a substantially horizontal surface of said apparatus body.

3. A probe apparatus according to claim 1, wherein said rotating means rocks the test head in a direction such that the test head moves toward or away from the probing card.

4. A probe apparatus according to claim 1, further comprising horizontal moving means for moving the test head in a horizontal direction perpendicular to the direction of ascent or descent of the test head caused by the vertical moving means.

5. A probe apparatus according to claim 1, further comprising locking means for locking the test head so that the test head is prevented from being rotated by the rotating means.

6. A probe apparatus comprising:

an apparatus body fitted with a probing card having a probe configured for electrical connection with an electrode of an object of inspection;

a test head including a plurality of terminals configured to electrically communicate with said probe of the probing card;

a support attached to the apparatus body and rotatably supporting the test head to rotate about an axis;

rotating means attached to the support and serving to rotate the test head about said axis; and first moving means attached to the support and serving to raise and lower the test head along a direction substantially perpendicular to said axis, said direction oriented such that said terminals engage said probe simultaneously when said test head is lowered by said first moving means.

7. A probe apparatus according to claim 6, wherein said first moving means vertically raises or lowers the test head over the probing card, with respect to the apparatus body wherein said probing card is exposed to the test head through a substantially horizontal surface of said apparatus body.

8. A probe apparatus according to claim 6, wherein said rotating means rocks the test head in a direction such that the test head moves toward or away from the probing card.

9. A probe apparatus according to claim 6, further comprising horizontal moving means for moving the test head in a horizontal direction perpendicular to the direction of ascent or descent of the test head caused by the vertical moving means.

10. A probe apparatus according to claim 6, further comprising locking means for locking the test head so that the test head is prevented from being rotated by the rotating means.

11. A probe apparatus according to claim 6, wherein said rotating means includes a first supporting unit supporting the test head for rotation and a rotating mechanism for rotating the test head with respect to the first supporting unit.

12. A probe apparatus according to claim 11, wherein said rotating mechanism includes a motor fixed to the first supporting unit and rotatory force transmitting means for transmitting the driving force of the motor as a rotatory force to the test head.

13. A probe apparatus according to claim 11, wherein said vertical moving means vertically raises or lowers the test head by vertically raising or lowering the first supporting unit.

14. A probe apparatus according to claim 13, wherein said vertical moving means includes a second supporting unit supporting the first supporting unit for up-and-down motion and a lift mechanism for vertically raising or lowering the first supporting unit with respect to the second support unit.

15. A probe apparatus according to claim 14, wherein said lift mechanism includes a motor fixed to the second support unit, a rotating unit adapted to be rotated by the driving force of the motor, and a conversion mechanism for converting the rotation of the rotating unit into an up-and-down motion of the first supporting unit.

16. A probe apparatus according to claim 9, wherein said rotating means includes a first supporting unit supporting the test head for rotation, said vertical moving means includes a second supporting unit supporting the first supporting unit for up-and-down motion, and said horizontal moving means includes a moving mechanism for moving the second supporting unit.

17. A probe apparatus according to claim 6, wherein said support is movably attached to the apparatus body.

* * * * *